United States Patent
Kraft et al.

(10) Patent No.: US 9,018,726 B2
(45) Date of Patent: Apr. 28, 2015

(54) PHOTODIODE AND PRODUCTION METHOD

(75) Inventors: Jochen Kraft, Oberaich (AT); Ingrid Jonak-Auer, Graz (AT); Rainer Minixhofer, Unterpremstätten (AT); Jordi Teva, Eindhoven (NL); Herbert Truppe, Graz (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 14/118,195

(22) PCT Filed: May 4, 2012

(86) PCT No.: PCT/EP2012/058296
§ 371 (c)(1),
(2), (4) Date: Feb. 19, 2014

(87) PCT Pub. No.: WO2012/156215
PCT Pub. Date: Nov. 22, 2012

(65) Prior Publication Data
US 2014/0203340 A1    Jul. 24, 2014

(30) Foreign Application Priority Data
May 19, 2011   (DE) .................. 10 2011 102 007

(51) Int. Cl.
| H01L 31/0232 | (2014.01) |
| H01L 31/0352 | (2006.01) |
| H01L 31/103 | (2006.01) |
| H01L 31/02 | (2006.01) |
| H01L 31/18 | (2006.01) |

(52) U.S. Cl.
CPC ...... *H01L 31/035281* (2013.01); *H01L 31/103* (2013.01); *Y02E 10/50* (2013.01); *H01L 31/02005* (2013.01); *H01L 31/18* (2013.01)

(58) Field of Classification Search
USPC ............................ 257/434, 436, 290; 438/67
See application file for complete search history.

(56) References Cited

U.S. PATENT DOCUMENTS

| 3,296,502 A | 1/1967 | Gross et al. |
| 4,507,674 A | 3/1985 | Gaalema |
| 4,857,980 A | 8/1989 | Hoeberechts |
| 5,254,868 A | 10/1993 | Saito |
| 5,510,272 A | 4/1996 | Morikawa et al. |

(Continued)

FOREIGN PATENT DOCUMENTS

| EP | 0279492 A1 | 8/1988 |
| EP | 0697743 A1 | 2/1996 |
| EP | 1653520 A1 | 5/2006 |
| JP | 2006080457 A | 3/2006 |
| WO | 97/23897 A2 | 7/1997 |

OTHER PUBLICATIONS

Gealer, R. e al: "Electrochemical etch-stop control for silicon structures containing electronic components", Journal of Applied Electrochemistry, vol. 18, 1988, pp. 463-468.

(Continued)

*Primary Examiner* — Errol Fernandes
(74) *Attorney, Agent, or Firm* — McDermott Will & Emery LLP

(57) ABSTRACT

The photodiode has a p-type doped region (2) and an n-type doped region (3) in a semiconductor body (1), and a pn junction (4) between the p-type doped region and the n-type doped region. The semiconductor body has a cavity (5) such that the pn junction (4) has a distance (d) of at most 30 µm from the bottom of the cavity (7).

6 Claims, 5 Drawing Sheets

(56) References Cited

U.S. PATENT DOCUMENTS

| | | | |
|---|---|---|---|
| 5,600,130 | A | 2/1997 | VanZeghbroeck |
| 6,175,141 | B1 | 1/2001 | Hofbauer et al. |
| 2008/0073740 | A1* | 3/2008 | Shibayama .................. 257/434 |
| 2010/0193893 | A1 | 8/2010 | Meinhardt et al. |
| 2010/0213560 | A1 | 8/2010 | Wang et al. |

OTHER PUBLICATIONS

Madou, M.: "Fundamentals of Microfabrication: The Science Miniaturization", CRC Press, Second Edition, 2001, pp. 211-220 and 232-239.

* cited by examiner

PHOTODIODE AND PRODUCTION METHOD

The present invention relates to a photodiode that is provided with a circuit, particularly a CMOS circuit, and detects incident radiation from the rear.

US 2010/0213560 A1 describes an image sensor in which an arrangement of pixels with a control circuit and an upper-side wiring is formed in a first substrate. A through-hole contact of a second substrate is connected to an uppermost conductor layer of the wiring and is provided with an electrical terminal on a free upper side of the second substrate. Incident light is provided from the rear side of the first substrate.

US 2010/0193893 A1 describes a method in which a semiconductor body is furnished with a circuit and is connected by means of a wafer bond method to an additional substrate in which the photodiode is formed. The circuit is connected to the semiconductor body by through-hole contacts. The rear side of the substrate furnished with the photodiode is thinned in order to allow incidence of light from that side.

The publication by R. L. Gealer, R. H. Hammerle, H. Karsten and H. S. Wroblowa: "Electrochemical etch-stop control for silicon containing electronic components" in J. Appl. Electrochemistry, vol. 18, pages 463-468 (1988) describes an etching process in which an electrochemical etch stop is created by a space charge zone. Etching processes in which an etch stop is created between high-doped and low-doped semiconductor material are described by Marc J. Madou in "Fundamentals of Microfabrication: the science of miniaturization," CRC Press, second edition 2001, particularly starting from page 211 for isotropic etching, and from page 232 for anisotropic etching.

Object of the present invention is to present a photodiode suitable for integration with a circuit and an associated production method.

The object is achieved with the photodiode comprising the features of claim 1, and with the method comprising the features of claim 6. Configurations derive from the respective dependent claims.

The photodiode has a p-type doped region and an n-type doped region in a semiconductor body, as well as a pn junction between the p-type doped region and the n-type doped region. The semiconductor body has a cavity, so that the pn junction has a distance of at most 30 µm from the cavity.

In embodiments, the pn junction has a distance of at most 15 µm or at most 10 µm from the cavity.

In another embodiment of the photodiode, the cavity has a side wall and a bottom, and the pn junction has the lowest distance from the cavity in the area of the bottom. A metallization that leaves the bottom free is present on the side wall.

In another embodiment of the photodiode, the metallization at the bottom of the cavity is electrically connected either to the p-type doped region or to the n-type doped region. Wiring is present on the front side of the semiconductor body and further wiring, which is electrically connected to the metallization, is present on the opposite, rear side. A through-hole contact that electrically connects the wiring to the further wiring is present in the semiconductor body.

In another embodiment of the photodiode, the cavity has a side wall and a bottom, and either the p-type doped region or the n-type doped region is arranged adjacent to the bottom.

In the method for producing the photodiode, a p-type doped region and an n-type doped region are produced in a semiconductor body, so that a pn junction is formed between the p-type doped region and the n-type doped region, and a cavity is etched into the semiconductor body. The pn junction and the cavity are formed in such a manner that the pn junction has a distance of at most 30 µm from the cavity.

In embodiments, the pn junction and the cavity are formed in such a manner that the pn junction has a distance of at most 15 µm from the cavity.

In another embodiment of the method, the semiconductor body is provided with a buried insulation layer. The pn junction and the cavity are produced on opposite sides of the insulation layer, and the cavity is etched until the insulation layer is reached.

In another embodiment of the method, the pn junction is formed before the etching of the cavity. By applying an electrical voltage to the pn junction, a space charge zone is created, and the cavity is etched until the space charge zone is reached.

In another embodiment of the method, the cavity has a side wall and a bottom, and the pn junction is formed by means of an implantation of dopant into the bottom of the cavity after etching the cavity.

In another embodiment of the method, the cavity has a side wall and a bottom, and a metallization is applied in the cavity and removed at its bottom.

A more detailed description of examples of the photodiode and the production method will follow, with reference to the appended figures.

Figure 1:
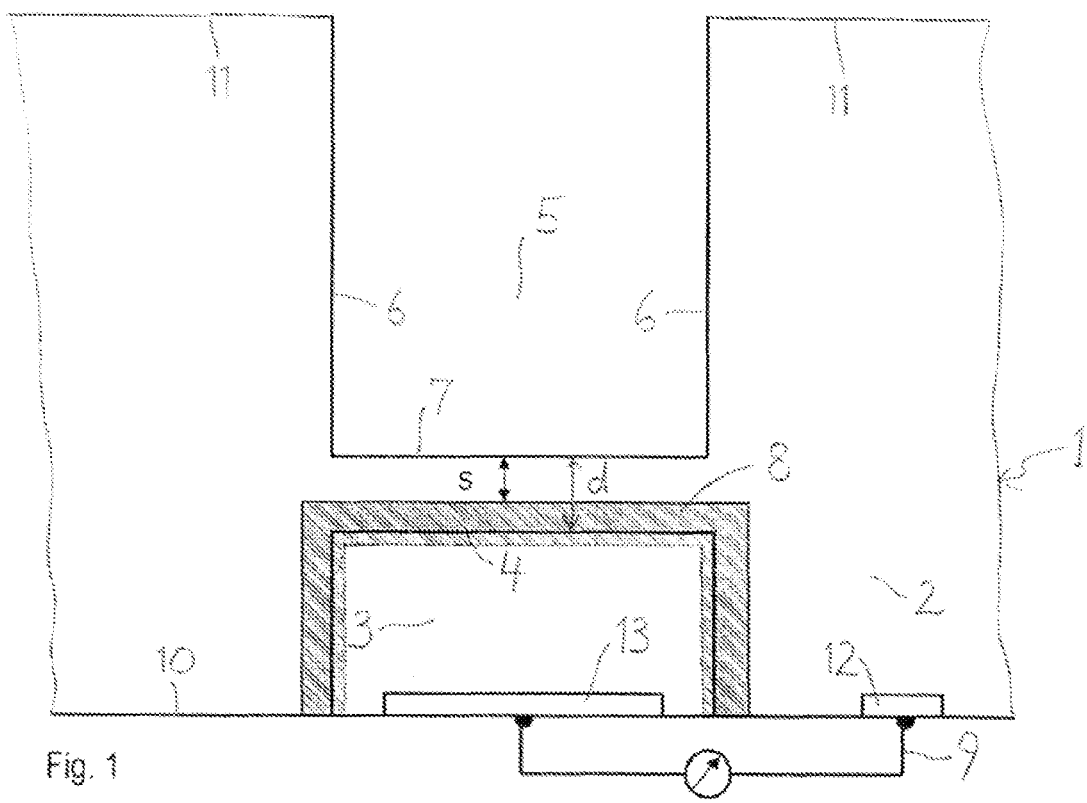
FIG. 1 is a cross section of an embodiment of the photodiode.

FIG. 1 shows a cross section through an embodiment of the photodiode. A semiconductor body 1 contains a p-type doped region and an n-type doped region, which form a pn junction. The semiconductor body 1 is provided in the illustrated embodiment with a base doping and forms the p-type doped region 2. The n-type doped region 3 is formed on the front side 10 of the semiconductor body 1, for example by an implantation of dopant. Using a p-type semiconductor body 1 is expedient; n-type and p-type can also be interchanged, however. The pn junction 4 is located at the boundary of the n-type doped region 3 in the semiconductor material. In embodiments of the photodiode, the pn junction 4 can be formed in a p-type doped semiconductor body 1, for example, with an n-type or high n-type ($n^+$-type) doped well, with a buried n-type layer or also with a p-type or $p^+$-type well in a deep n-type well. This listing of possibilities for forming the pn junction 4 is not exhaustive.

The cavity 5, which can have a side wall 6 and a bottom 7 in particular, is located at the rear side 11 of the semiconductor body 1, so that a distance d of at most 30 µm exists between the pn junction 4 and the cavity 5. Between the n-type doped region 3 and the bottom 7 of the cavity 5, there is consequently a relatively thin layer of p-type doped semiconductor material present. The distance d can also be smaller, for example at most 15 µm or even at most 10 µm, depending upon the application for which the photodiode is intended. The cavity 5 is illustrated in the figures with a flat bottom 7; the bottom 7 can instead be curved. The side wall 6 can also have a curvature in the drawing plane of the figures and/or be inclined.

A wiring structure 9, known conventionally from integrated circuits, which has metal planes structured to form conductor traces in an intermetal dielectric and is schematically reproduced in the figures, can be arranged on the front side 10 and be provided for electrical connection to an integrated circuit, more particularly a CMOS circuit, in the semiconductor body 1. A low connection resistance for applying an electrical voltage is preferably effected by a high p-type doped contact region 12 formed in the p-type doped region 2, and a high n-type doped contact region 13 formed in the n-type doped region 3.

In the operation of the photodiode, a voltage is applied in the blocking direction, so that a space charge zone 8 is formed or enlarged at the pn junction 4. Because the space charge zone 8, which is represented by hatching in the figures, is a short distance s away from the bottom 7 of the cavity 5, radiation that is incident from the rear side 11 and strikes the bottom 7 of the cavity 5 can reach the area of the space charge zone 8 and be detected there.

Electromagnetic radiation with a wavelength of, for example, 410 nm, 660 nm, 780 nm or 850 nm is 70% absorbed in silicon at a length of approximately 0.14 µm, 3.9 µm, 10 µm and 15 µm, respectively. The distance d between the pn junction 4 and the cavity 5 must be selected to be sufficiently small that the radiation incident at the bottom 7 of the cavity 5 reaches up to the space charge zone 8, the size of which depends on the applied voltage. The distance s between the space charge zone 8 and the cavity 5 should not be greater than approximately 10 µm for detecting green light, and not greater than approximately 15 µm for detecting infrared light, if the semiconductor body 1 is silicon.

Components of the circuit that are integrated in the semiconductor body 1 outside the region of the cavity 5 on the front side 10 are protected from radiation incident from the back side by the filtering effect of the semiconductor material in the semiconductor body 1, which is relatively thick on the sides of the cavity 5. This prevents impairment of the functioning of the circuit by incident light. This photodiode is therefore suitable and advantageous for integration with a circuit, particularly a CMOS circuit.

The cavity 5 is preferably produced after production of the pn junction 4, but it can also be produced before production of the pn junction 4. The cavity 5 is preferably produced by etching the semiconductor material of the semiconductor body 1. DRIE (deep reactive ion etching) is particularly suitable for this purpose. A precision up to deviations of a few microns can be achieved with such an etching process if the achieved etching depth is first measured on samples. The manner in which to proceed is fundamentally known to a person skilled in the art and therefore need not be described further.

One possibility for a precisely defined etch stop is offered by a transition from a low-doped semiconductor region to a high-doped semiconductor region. That is described in the publication by Marc J. Madou cited above. An abrupt and precisely localized transition from high-doped semiconductor material to low-doped semiconductor material can be formed by means of a low-doped epitaxial layer on a high-doped semiconductor substrate or by means of a high-doped epitaxial layer on the low-doped semiconductor substrate.

Figure 2:
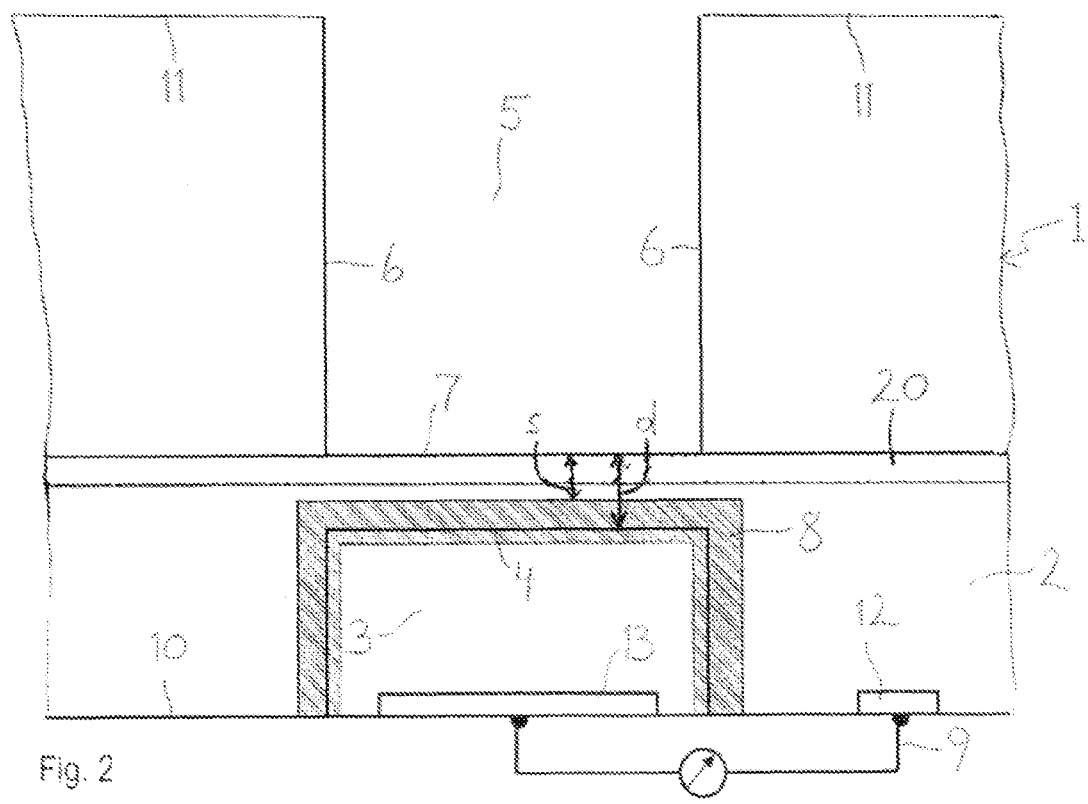
FIG. 2 is a cross section of a further embodiment of the photodiode comprising an insulation layer used as an etch stop in the semiconductor body.

FIG. 2 shows a cross section according to FIG. 1 for another embodiment, in which an insulation layer 20, which can be an oxide of a semiconductor material, for example, is buried in the semiconductor body 1. This is the structure of an SOI (silicon on insulator) substrate. The other components of the photodiode correspond to the embodiment according to FIG. 1 and are furnished with the same reference symbols. The embodiment in FIG. 2 has the advantage that the insulation layer 20 can be used as an etch stop layer during etching of the cavity 5, so that the distance d between the pn junction 4 and the bottom 7 of the cavity 5 can be produced very precisely.

Figure 3:
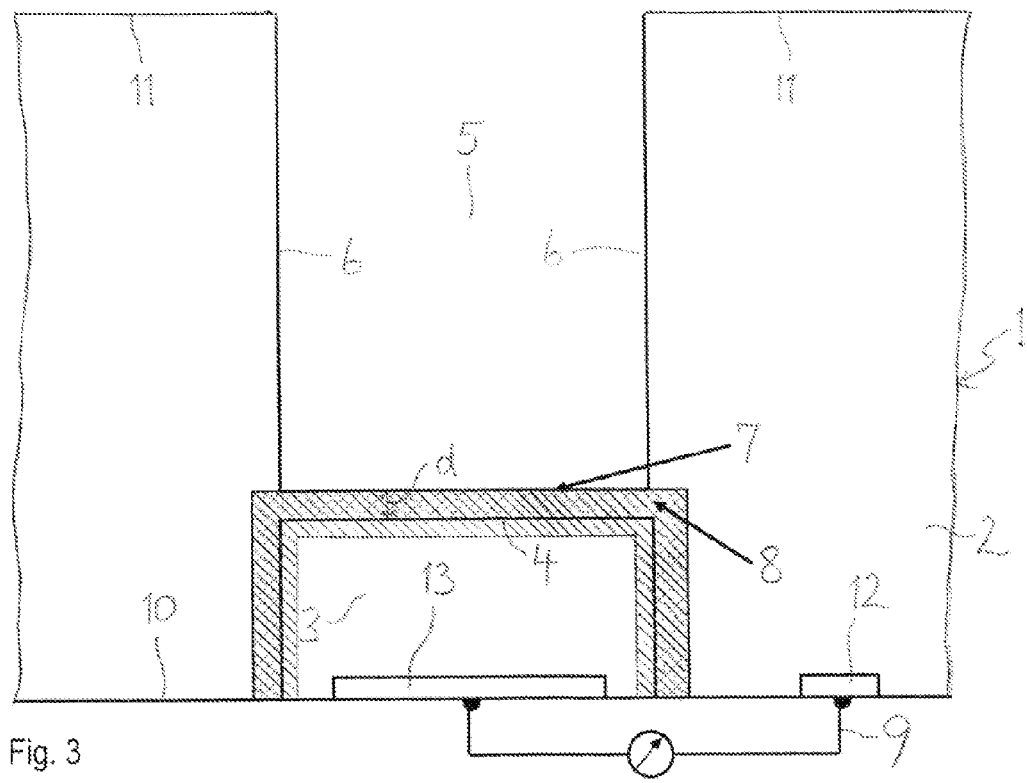
FIG. 3 is a cross section of a further embodiment with a space charge zone acting as an etch stop layer.

FIG. 3 shows a cross section according to FIG. 1 of an additional embodiment, which can be produced by means of electrochemical etching (ECE). For this purpose, an electrical voltage is applied to the pn junction 4 in the blocking direction in order to form the space charge zone 8 in the desired size. The cavity 5 can be etched by a wet chemical means, for example, and the etching stops at the space charge zone 8. This conventionally known etching method with electrochemical etch stop is described in the above-cited publication by R. L. Gealer et al.

Figure 4:
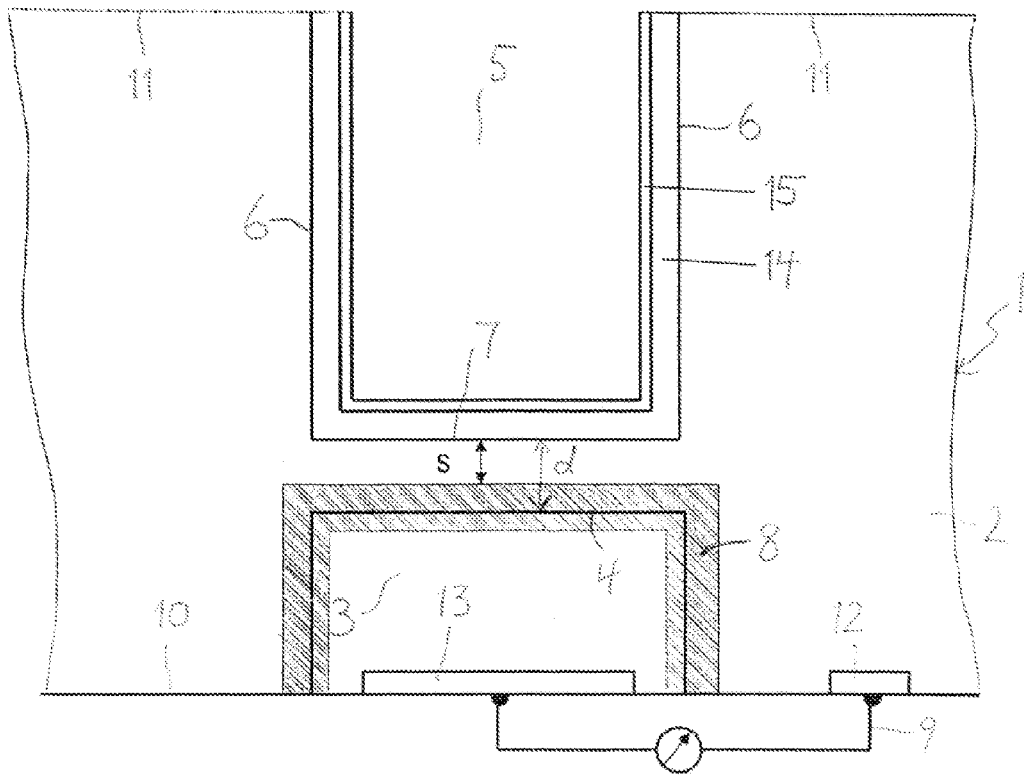
FIG. 4 is a cross section of a further embodiment, in which a metallization is applied in the cavity.

FIG. 4 shows a cross section according to FIG. 1 for another embodiment, in which the surface of the semiconductor body 1 is provided inside the cavity 5 with an insulation 14 and a metallization 15 applied thereto. The insulation 14 can be, for example, a thin layer made from an oxide of the semiconductor material. The metallization 15 can be formed, for example, from a thin TiN layer as an adhesion promoter and a tungsten layer. TiN can be applied by means of ALD (atomic layer deposition) and tungsten can be applied by means of CVD (chemical vapor deposition). The metallization 15 is preferably provided as a mirror on the side wall 6 of the cavity 5, in order to reflect incident radiation to the bottom 7 of the cavity 5 and in this manner increase the portion of radiation that reaches the photodiode and can be detected. The metallization 15 is preferably removed from the bottom 7 of the cavity 5.

Figure 5:
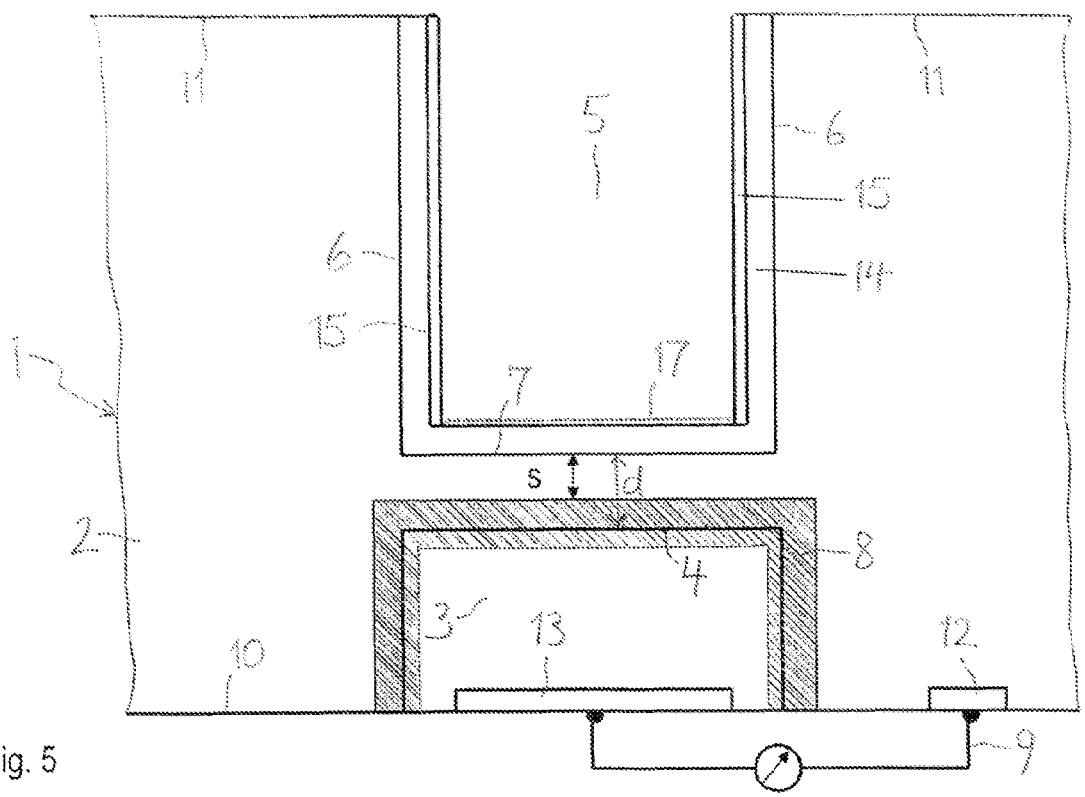
FIG. 5 is a cross section according to FIG. 4 of a further embodiment, in which the metallization is removed at the bottom of the cavity.

FIG. 5 shows a cross section of an embodiment according to FIG. 4, in which the metallization 15 has been removed from the bottom 7 of the cavity 5. The other components of the photodiode correspond to the embodiment according to FIG. 4 and are furnished with the same reference symbols. An anti-reflection layer 17 can be provided at the bottom 7 of the cavity 5. Such an anti-reflection layer 17 can also be provided for the other embodiments.

Figure 6:
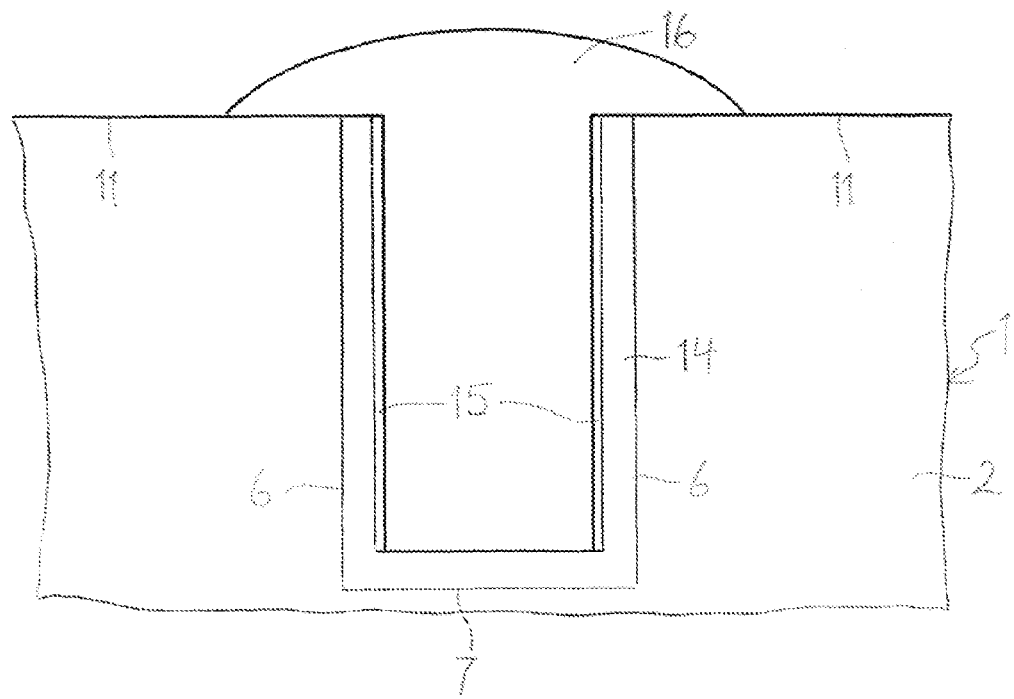
FIG. 6 is a cross section according to FIG. 5 after the production of a lens in the cavity.

FIG. 6 shows a cross section of a region around the cavity 5 for an embodiment according to FIG. 5, but in which a lens 16 is arranged in the cavity 5. The lens 16 is provided for concentrating the incident light and is produced from a material transparent to the radiation to be detected, in particular an optically transparent material, with which the cavity 5 is filled. The curved surface of the lens 16 can be produced by means of nanolithography (nanoimprint lithography), for example. The material of the lens 16 can optionally be cured using UV radiation. It is advantageous if the cavity 5 is filled, because this stabilizes the remaining thin semiconductor layer of the semiconductor body 1 remaining at the bottom 7 of the cavity 5. Such a lens 16, which was described here only in connection with the embodiment according to FIG. 5, can also be provided for the other embodiments.

Figure 7:
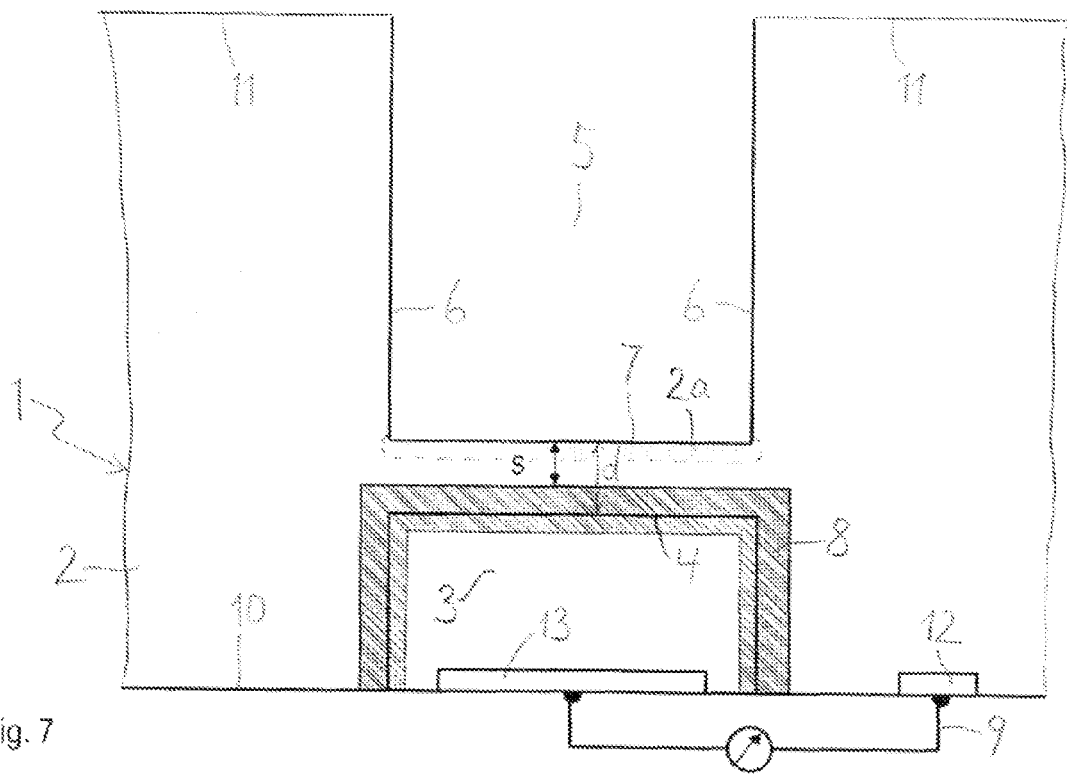
FIG. 7 is a cross section according to FIG. 1 of an embodiment in which a further doping of the same conductivity type has been provided at the bottom of the cavity.

FIG. 7 shows a cross section according to FIG. 1 for an embodiment in which a further doping of the same conductivity type, p-type in the present case, is undertaken at the bottom 7 of the cavity 5. This can be accomplished, for example, by implantation of dopant into the cavity 5. A recrystallization of the semiconductor material preferably then takes place. In this manner, a p-type doped subregion 2a, which is doped more highly than the other p-type region 2, is formed at the bottom 7 of the cavity 5. The higher doping brings about a higher electrical conductivity, whereby the response time of the photodiode is reduced.

Figure 8:
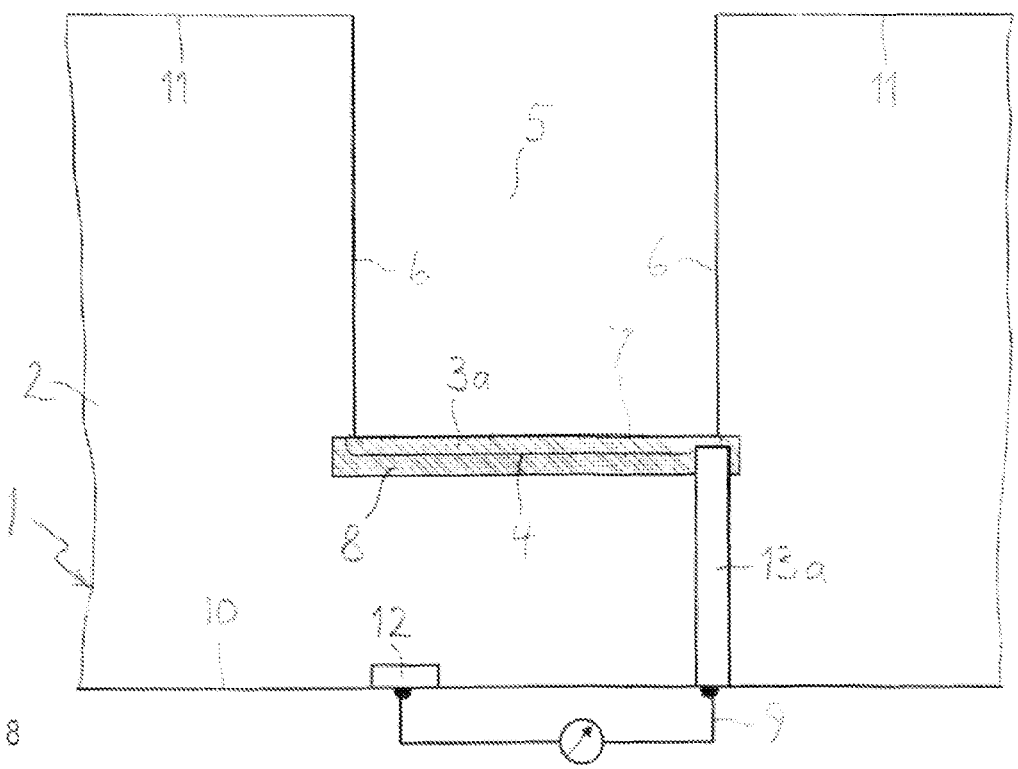
FIG. 8 is a cross section of an embodiment with a doped region formed at the bottom of the cavity, self-adjusted with respect to the cavity.

FIG. 8 shows a cross section through an additional embodiment, in which an n-type doped region 3a is arranged at the bottom 7 of the recess 5. In this embodiment, the semiconductor body 1 is doped and forms a doped region, the p-type doped region 2 of the photodiode for example. The pn junction 4 is created after production of the cavity 5. This is preferably done by implanting a dopant in the bottom 7 of the recess 5, said dopant being provided for the conductivity type that is opposite that of the semiconductor material present therein, and in the present example is n-type conductivity. The n-type doped region 3a, which forms the pn junction 4 together with the adjoining p-type doped semiconductor material, is formed by the implantation of the dopant. The space charge zone 8, which is shown with hatched lines, is located in this embodiment very close to the bottom 7 of the cavity 5 and can extend up to the bottom 7 of the cavity 5, particularly if a high electric voltage is applied in the blocking direction to the pn junction 4. An n-type doped connection region 13a can be provided for electrically connecting the n-type doped region 3a. The connection region 13a can be formed in the manner of a through-hole contact (via) or as a trench filled with electrically conductive material. Connection regions extending deep into a semiconductor body are also referred to by the term sinker contacts.

Figure 9:
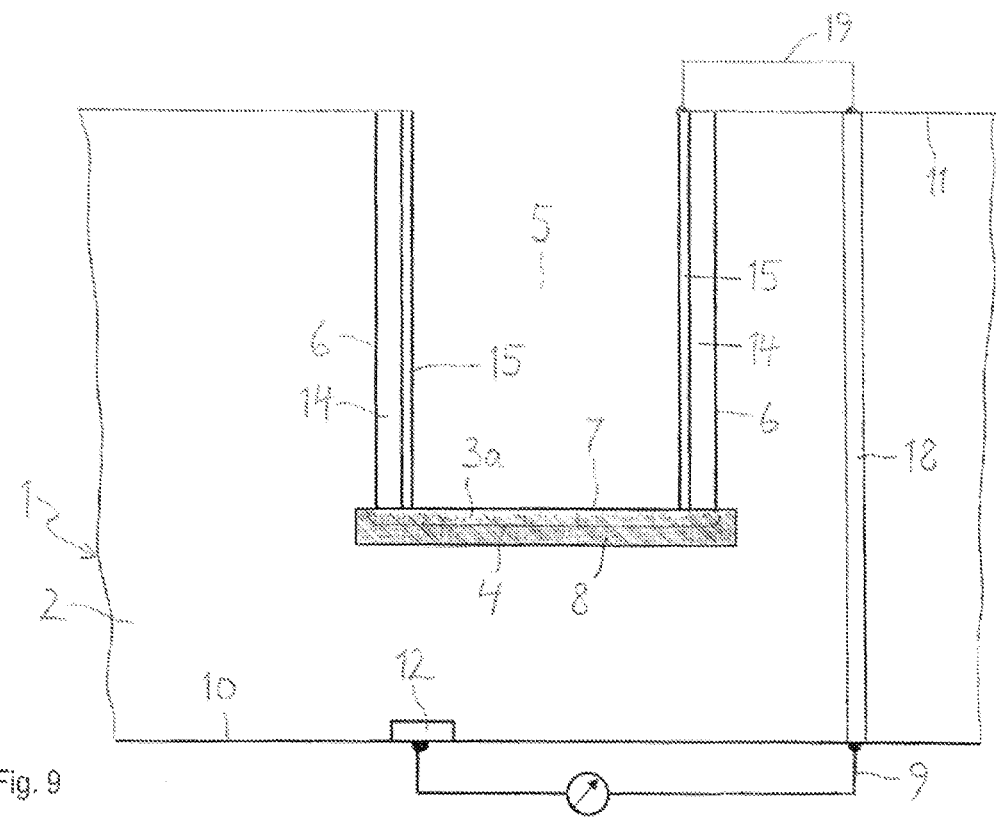
FIG. 9 is a cross section of an embodiment of the photodiode comprising a through-hole contact.

FIG. 9 shows a cross section according to FIG. 8 for a similar embodiment, in which the doped region 3a, n-type in this example, is connected at the bottom 7 of the cavity 5 by means of a metallization 15 applied in the cavity 5. The metallization 15 can be removed from the bottom 7 of the recess 5 outside the contact of the metallization with the doped region 3a, as in the embodiment according to FIG. 5, in order to expose the bottom 7. An insulation 14, which can be arranged between the semiconductor body 1 and the metallization 15, is preferably likewise removed or omitted at the bottom 7 of the recess 5. For electrically connecting the n-type doped region 3a to an integrated circuit arranged on the front side 10, a through-hole contact 18 connected to the wiring 9 can be provided in the semiconductor body 1 and further wiring 19 can be provided on the rear side 11.

Elements of the embodiments that correspond to one another are furnished with the same reference symbols in the figures. Components of an integrated circuit are arranged on the side of the area occupied by the cavity 5 and are preferably arranged on the front side 10. A metallization 15 as in the embodiments of FIGS. 4, 5, 6 and 9, a lens 16 as in the embodiment of FIG. 6 and/or an anti-reflection layer 17 as in the embodiment of FIG. 5 can be provided independently of one another in all embodiments, in order to increase the portion of the incident radiation detected by the photodiode.

The photodiode is particularly suitable for all applications in which a circuit is integrated on the front side of the component and the radiation to be detected is incident from the rear side of the photodiode. The photodiode offers the particular advantage that the electronic components of the circuit are shielded by the thick semiconductor body, whereas the radiation to be detected can reach up to the space charge zone of the photodiode. Due to the filtering effect of the semiconductor material, the range of wavelengths to be detected can also be limited by the selection of the distance between the pn junction of the photodiode and the bottom of the cavity in the semiconductor body. The arrangement of the pn junction offers a variety of possibilities for connecting the photodiode to an integrated circuit. Various production methods, particularly etching methods, can be used economically in order to realize the dimensions of the elements essential to the functioning of the photodiode within narrow tolerance limits.

LIST OF REFERENCE SYMBOLS

1 Semiconductor body
2 p-type doped region
2a p-type doped subregion
3 n-type doped region
3a n-type doped region
4 pn junction
5 Cavity
6 Side wall
7 Bottom
8 Space charge zone
9 Wiring
10 Front side
11 Rear side
12 p-type doped contact region
13 n-type doped contact region
13a Connection region
14 Insulation
15 Metallization
16 Lens
17 Anti-reflection layer
18 Through-hole contact
19 Further wiring
20 Insulation layer
d Distance
s Distance

The invention claimed is:
1. A photodiode, comprising:
a semiconductor body,
a p-typed doped region in the semiconductor body,
an n-typed doped region in the semiconductor body,
a pn junction between the p-type doped region and the n-type doped region, and
a cavity of the semiconductor body,
wherein
the pn junction has a distance of at most 30 µm from the cavity,
the cavity has a side wall and a bottom,
the pn junction has a lowest distance from the cavity in the area of the bottom,
a metallization that leaves the bottom free is present on the side wall,
the metallization is electrically connected at the bottom of the cavity either to the p-type doped region or to the n-type doped region,
a wiring is present on a front side of the semiconductor body,
a further wiring is present on a rear side opposite the front side and is electrically connected to the metallization, and
a through-hole contact electrically connecting the wiring to the further wiring is present in the semiconductor body.
2. The photodiode according to claim 1, wherein
the pn junction has a distance of at most 15 µm from the cavity.

3. A method for producing a photodiode, wherein
a p-type doped region and an n-type doped region are produced in a semiconductor body, so that a pn junction is formed between the p-type doped region and the n-type doped region, and
a cavity is etched into the semiconductor body,
the pn junction and the cavity are formed in such a manner that the pn junction has a distance of at most 30 μm from the cavity,
the cavity has a side wall and a bottom, and
a metallization is applied in the cavity and removed at the bottom.

4. The method according to claim 3, wherein
the semiconductor body is provided with a buried insulation layer,
the pn junction and the cavity are produced on opposite sides of the insulation layer, and
the cavity is etched until the insulation layer is reached.

5. The method according to claim 3, wherein
the pn junction is formed before the etching of the cavity,
a space charge zone is created by applying an electrical voltage to the pn junction, and
the cavity is etched until the space charge zone is reached.

6. The method according to claim 3, wherein
the cavity has a side wall and a bottom, and
the pn junction is formed by means of an implantation of dopant into the bottom of the cavity after the etching of the cavity.

\* \* \* \* \*